US 6,699,773 B2

(12) United States Patent
Lee et al.

(10) Patent No.: US 6,699,773 B2
(45) Date of Patent: Mar. 2, 2004

(54) SHALLOW TRENCH ISOLATION TYPE SEMICONDUCTOR DEVICE AND METHOD OF FORMING THE SAME

(75) Inventors: Keum-Joo Lee, Inchun (KR); Young-Min Kwon, Suwon (KR); Chang-Lyoung Song, Suwon (KR); In-Seak Hwang, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/274,032

(22) Filed: Oct. 21, 2002

(65) Prior Publication Data

US 2003/0042539 A1 Mar. 6, 2003

Related U.S. Application Data

(62) Division of application No. 09/917,646, filed on Jul. 31, 2001, now Pat. No. 6,500,726.

(30) Foreign Application Priority Data

Aug. 1, 2000 (KR) .......................... 2000-44634

(51) Int. Cl.[7] .................. H01L 21/76; H01L 21/302
(52) U.S. Cl. .................. 438/424; 438/425; 438/426; 438/429; 438/439; 438/442; 438/443; 438/444; 438/706; 438/745; 438/749; 438/756; 438/757
(58) Field of Search .................. 438/424, 425, 438/426, 429, 439, 442, 443, 444, 706, 745, 749, 756, 757

(56) References Cited

U.S. PATENT DOCUMENTS 5,747,866 A    5/1998   Ho et al.
6,331,469 B1 * 12/2001  Park et al. .................. 438/296
2001/0021567 A1 * 9/2001 Takahashi .................. 438/424

* cited by examiner

Primary Examiner—John F. Niebling
Assistant Examiner—Stanetta Isaac
(74) Attorney, Agent, or Firm—Lee & Sterba, P.C.

(57) ABSTRACT

A method of forming a shallow trench isolation type semiconductor device comprises forming an etch protecting layer pattern to define at least one active region on a substrate, forming at least one trench by etching the substrate partially by using the etch protecting layer pattern as an etch mask, forming a thermal-oxide film on an inner wall of the trench, filling the trench having the thermal-oxide film with a CVD silicon oxide layer to form an isolation layer, removing the etch protecting layer pattern from the substrate over which the isolation layer is formed, removing the thermal-oxide film formed on a top end of the inner wall of the trench to a depth of 100 to 350 Å, preferably 200 Å from the upper surface of the substrate, and forming a gate oxide film on the substrate from which the active region and the top end are exposed.

5 Claims, 8 Drawing Sheets

SHALLOW TRENCH ISOLATION TYPE SEMICONDUCTOR DEVICE AND METHOD OF FORMING THE SAME

This application is a DIVISION of application Ser. No. 09/917,646, filed Jul. 31, 2001 now U.S. Pat. No. 6,500,726.

BACKGROUND OF THE INVENTION

1. Field of the Invention

The present invention relates to a shallow trench isolation (STI) type semiconductor device and method of forming the same. More particularly, the present invention relates to a STI type semiconductor device and method of forming the same, which can prevent the electric field from concentrating to an edge portion of a substrate in an active region.

2. Description of the Related Art

As the elements incorporated into a semiconductor device are integrated to a high degree, there is a growing tendency to increasingly use an STI method as a method of forming an isolation layer as compared with a local oxidation of silicon (LOCOS) method.

The STI method generally comprises etching a substrate to form trenches for isolation, and filling the trenches with an insulating layer. Thus, each of isolated regions is separated by the trenches and the insulating layer filled therein. However, when the trenches are filled with an oxide layer for insulation and a subsequent thermal process is carried out, the oxygen diffusion sometimes occurs at interfaces or edges of the oxide layer to oxidize corresponding portions of the inner walls of the trenches additionally. At this time, since the volume is increased due to the oxidation, damage such as a dislocation of crystallized structure may occur.

To solve this problem, there is proposed a method of using a silicon nitride liner. An example of that method is disclosed in U.S. Pat. No. 5,747,866 to Ho et al., in which, after the silicon nitride liner is formed on an inner wall of a trench, the trench is filled with a silicon oxide layer. At this time, the silicon nitride liner acts as an oxygen diffusion stop layer to prevent the damage of the substrate due to the oxidation. However, in this case, another problem may be presented, as described below.

FIG. 1 to FIG. 4 illustrate flow diagrams of the process steps of a conventional method of forming an STI type semiconductor device, demonstrating a problem when a silicon nitride liner is formed in an inner wall of a trench.

Referring to FIG. 1, first a pad oxide film 11 is formed on a substrate 10. Then, a silicon nitride layer as an etch protecting layer 13 is deposited on the pad oxide film 11. Thereafter, the etch protecting layer 13 in a trench-intended region is removed by means of a patterning process. The patterning process is carried out through a general photolithography and etching. Continuously, the substrate 10 is etched to form a trench 15 by using the etch protecting layer 13 as a mask.

Referring to FIG. 2, an inner wall oxide film 17 is formed to a thickness of 200 to 300 Å in an inner wall of the trench 15 by means of a thermal oxidation process. The thermal oxidation process cures damages generated on the inner wall of the trench 15 during the etching process for forming the trench 15. Then, a silicon nitride layer is formed over the whole surface of the substrate 10. Consequently, a liner 19 is formed in the inner wall of the trench 15.

Referring to FIG. 3, a CVD silicon oxide layer 21 is deposited over the substrate 10 over which the liner 19 is formed. As a result, the trench 15 is filled with the CVD silicon oxide layer 21. Then, the portion of the CVD silicon oxide layer 21 formed on the etch protecting layer 13 in an active region is removed by planarization etching.

Referring to FIG. 4, the etch protecting layer 13 covering the active region is wet-etched and removed. At this time, a top end of the liner 19 coming in contact with the etch protecting layer 13 is also removed. Particularly, since the etch protecting layer 13 is over-etched to be completely removed, the top end of the liner 19 is deeply etched below the upper surface of the substrate 10. Consequently, a reduced liner 19' only remains between the isolation layer and the active region, so that a 'dent' phenomenon of forming a concave space in the place in which the removed top end of the liner 19 was located occurs. This concave space is enlarged in the following cleaning process, when the CVD silicon oxide layer 21 and the inner wall oxide film 17 adjacent thereto are etched by means of a fluoride containing detergent.

When the 'dent' phenomenon occurs, the concave space may be filled with polysilicon in the following process for forming gates. Polysilicon filled in the concave space may result in a gate bridge. Also, it may cause a 'hump' phenomenon of forming parasite transistors, which makes normal transistor elements not form the linear transistor characteristic, and increases of the leakage current.

To prevent the 'dent' phenomenon, various methods have been proposed. Among these methods are, an STI method using a pull back process, which is disclosed in Korean Patent Application No. 98-21,037. According to that Korean Patent Application, after forming a trench as shown on FIG. 1, an etch protecting layer 13 covering an active region is isotropically etched to form a reduced pattern 13' which exposes a portion of the active region around the trench 15 as shown in FIG. 5. Then, an inner wall of the trench 15 is oxidized to form an inner wall oxide film 17 to a thickness of 150 to 300 Å. Thereafter, a silicon nitride film as a liner 19 is formed. As the liner 19 is formed, the portion of the active region around the trench 15 is almost covered with the liner 19, as shown in FIG. 6.

Next, a CVD silicon oxide layer 21 is deposited over the substrate 10 to fill the trench 15. Then, a portion of the CVD silicon oxide layer 21 formed over the etch protecting layer 13 in an active region is removed by planarization etching. Thereafter, the reduced pattern 13' is wet-etched. At this time, a top end of the liner 19 covering the portion of the active region around the trench 15 is removed, but a portion of the liner 19 formed on the inner wall of the trench 15 remains, as shown in FIG. 7. Thus, the 'dent' phenomenon of forming the concave space in the vicinity of the top end of the inner wall of the trench 15 can be prevented.

However, in the STI method using the pull back process, a top end of the inner wall of the trench 15, i.e., an edge portion of the upper surface of the substrate in the active region is covered with the liner 19' and the inner wall oxide film 17, so that when a gate insulating film is formed after removing the etch protecting layer and the pad oxide film 11, oxygen is not supplied thereto very well. Accordingly, an oxide layer forming the gate insulating film is thinly formed on the edge portion of the upper surface of the substrate in the active region in the vicinity of the top end of the inner wall of the trench 15 compared with that on the other portion. This may result in problems of reducing the value of the breakdown charge $Q_{bd}$ to deteriorate the reliability in the insulation, and generating the leakage current.

Also, in other method for preventing the 'dent' phenomenon, an edge portion of the upper surface of the substrate in the active region is also protected very well, so that it comes to have an angled shape while the etching processes for forming trenches are carried out. When the edge portion has an angular shape, the high electric field can be concentrated thereto, thereby resulting in the insulation damage or the current leakage.

SUMMARY OF THE INVENTION

It is a feature of an embodiment of the present invention to provide an improved STI type semiconductor device and method of forming the same, which can prevent the 'dent' phenomenon and decrease the degradation in the transistor characteristic resulting from the substrate having an angled shape at an edge portion of the upper surface of a substrate in an active region.

This and other features are provided, according to the present invention, by an STI type semiconductor device comprising at least one trench formed on a silicon substrate to define at least one active region, a silicon thermal-oxide film formed on an inner wall of the trench, and a CVD silicon oxide layer filling the trench on which the silicon thermal-oxide film is formed. An edge portion of the substrate in the active region forming a top end portion of the inner wall of the trench has a radius of curvature more than twice larger than a thickness of a gate oxide layer formed on the edge portion.

Also, the present invention is adapted to apply when a pull back process is used and a liner for an oxygen barrier is formed to be extended to an edge of the substrate in the active region. In the pull back process, a portion of the liner extended up from an upper surface of the substrate forming the active region is mainly removed as an etch protecting pattern and is wet-etched to be completely removed.

The liner for the oxygen barrier is formed of silicon nitrides. When the pull back process is carried out, an etch protecting layer forming the etch protecting pattern is etched to reduce its thickness and width. The reduced width of the etch protecting layer is within the range of 50 to 1,000 Å. Accordingly, the liner is formed to be further enlarged by as much as 50 to 1,000 Å onto the upper surface of the substrate in the active region. After the etch protecting layer pattern is wet-etched to be removed, a top end of the liner is maintained at the same level as or at a level higher than the upper surface of the substrate. Also, after an over-etching process is carried out to remove a top end of the thermal-oxide film formed on the inner wall of the trench, the top end of the liner is maintained above a level that is located under 150 Å from the upper surface of the silicon substrate.

According to another aspect of the present invention, there is provided a shallow trench isolation type semiconductor device comprising an isolation layer formed on a silicon substrate to define at least one active region, and a liner for an oxygen diffusion barrier interposed between the isolation layer and the silicon substrate. A horizontal distance from a top end of an inner wall of the liner to a corresponding level position on a plane vertically extended from an edge of an upper surface of the isolation layer is within the range of 300 to 600 Å and that a line extended from a center of an upper surface of the substrate in the active region to an edge of the upper surface of the substrate in the active region adjacent to the isolation layer has an angle of 15 to 35 degrees to a horizontal plane.

According to another aspect of the present invention, there is provided a method of forming a shallow trench isolation type semiconductor device comprising forming an etch protecting layer pattern defining at least one active region on a substrate, forming at least one trench by etching the substrate partially by using the etch protecting layer pattern as an etch mask, forming a thermal-oxide film on an inner wall of the trench, filling the trench having the thermal-oxide film with a CVD silicon oxide layer to form an isolation layer, removing the etch protecting layer pattern from the substrate on which the isolation layer is formed, removing the thermal-oxide film formed on a top end of the inner wall of the trench to the depth of 100 to 350 Å, preferably 200 Å from the upper surface of the substrate, and forming a gate oxide film on the substrate through which the active region and the top end are exposed.

In a preferred method of the present invention, forming the gate oxide film includes forming a buffer oxide film for ion implantation on the substrate through which the active region and the top end are exposed, removing the buffer oxide film after ion implantation, and forming the gate oxide film on the substrate on which the buffer oxide film is removed, by means of a thermal oxidation process.

Forming the etch protecting layer pattern includes forming a silicon nitride layer or a silicon nitride-oxide layer over the substrate on which a pad oxide film is formed, and patterning it. Therefore, the method of the present invention includes removing the pad oxide film after removing the etch protecting layer pattern. Also, removing the thermal-oxide film is carried out along with removing the pad oxide film.

Alternatively, forming the etch protecting layer pattern can include forming a thin silicon oxide layer as a sacrificial layer before patterning.

As apparent from the foregoing, the present invention is used under the conditions that after the etch protecting layer is removed, the edge portion of the upper surface of the substrate in the active region adjacent to the trench has an angled shape and the thermal-oxide film disposed in the inner wall of the trench is remained above the level which is located below 150 Å from the upper surface of the substrate. Accordingly, the present invention is adapted to use in a STI type semiconductor device using a pull back process.

Also, the present invention can obtain a good effect when a thickness of the thermal-oxide film disposed in the inner wall of the trench is above about 200 Å. The reason is that when the thermal-oxide film is removed, the edge portion of the substrate in the active region forming the top end of the inner wall of the trench is exposed to a space corresponding to the thickness of the thermal-oxide film. The more the edge portion is exposed, the more it is oxidized when the buffer oxide layer is forming. Also, the more the edge portion of the substrate in the active region is oxidized, the more it becomes rounded or curved. This rounded profile prevents a thickness of the gate insulating film from being thin in the edge portion when it is formed. Also, as the curvature of the edge portion of the substrate in the active region is more rounded, the high electric field can be prevented from being concentrated thereto, thereby reducing the insulation damage.

These and other features and aspects of the present invention will be readily apparent to those of ordinary skill in the art upon review of the detailed description that follows.

BRIEF DESCRIPTION OF THE DRAWINGS

The foregoing and other features and advantages of the present invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Korean Patent Application No. 2000-44634, filed on Aug. 1, 2000, and entitled: "Shallow Trench Isolation Type Semiconductor Device and Method of Forming the Same," is incorporated by reference herein in its entirety.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully cover the scope of the invention to those of ordinary skill in the art. Like numbers refer to like elements throughout.

Figure 15:
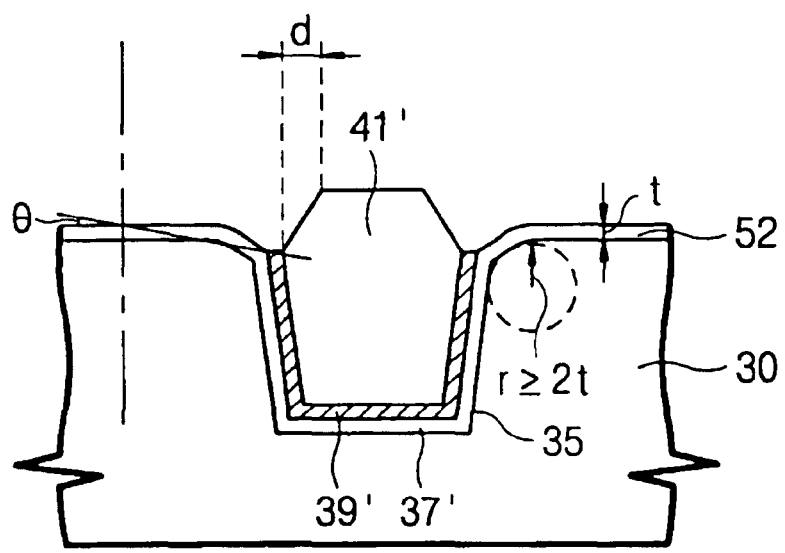

Referring to FIG. 15, there is illustrated an isolation layer portion of a STI type semiconductor device in accordance with the present invention.

The semiconductor device of the present invention comprises a trench 35 formed on a silicon substrate 30 to define an active region, a silicon thermal-oxide film 37' formed on an inner wall of the trench 35, and a CVD silicon oxide layer filling the trench 35 on which the silicon thermal-oxide film 37' is formed, to form an isolation layer 41'. A liner 39' for an oxygen diffusion barrier is interposed between the isolation layer 41' and the silicon thermal-oxide film 37'. An edge portion of the upper surface of the substrate 30 in the active region adjacent to the isolation layer 41' has a radius of curvature, r, which is more than twice as much as a thickness, t, of a gate oxide film 52 formed on the edge portion.

Also, the isolation layer 41' is formed to satisfy the conditions that a horizontal distance, d, from a top end of an inner surface of the liner 39' to a corresponding level position on a plane vertically extended from an edge of an upper surface of the isolation layer 41' is within the range of 300 to 600 Å, and that a line extended from a center of the upper surface of the substrate 30 in the active region to an edge of the upper surface of the active region adjacent to the isolation layer 41' has an angle θ of 15 to 35 degrees to a horizontal plane. The isolation layer structure of the present invention is more curved as compared with a horizontal distance of about 250 Å and a line slope of 9 to 14 degrees in the conventional STI method using the pull back process. Particularly, the isolation layer structure of the present invention is greatly curved as compared with a line slope of about 50 degrees in the conventional STI method having the 'dent' problem. Thus, since in the present invention, the edge portion of the upper surface of the substrate in the active region has a more rounded profile, the electric field concentrated thereto can be reduced and maintained similar to other portion of the substrate, thereby reducing the insulation damage or the current leakage.

The method of forming the STI type semiconductor device in accordance with the present invention will now be explained in detail with reference to FIGS. 8 through 15.

FIGS. 8 through 15 illustrate flow diagrams of the process steps of a method of forming the STI type semiconductor device of the present invention.

Figure 1:
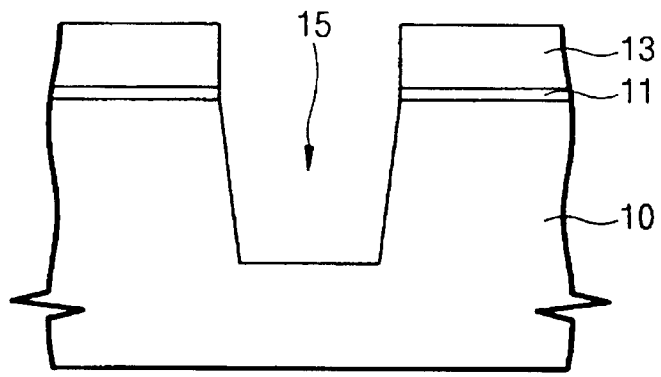
FIG. 1 to FIG. 4 illustrate flow diagrams of the process steps of a conventional method of forming a STI type semiconductor device, showing a problem generated when a silicon nitride liner is formed on an inner wall of a trench.
Figure 2:
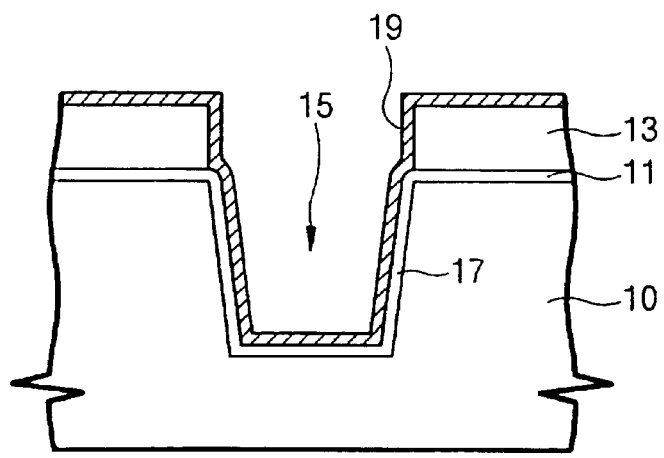
Figure 3:
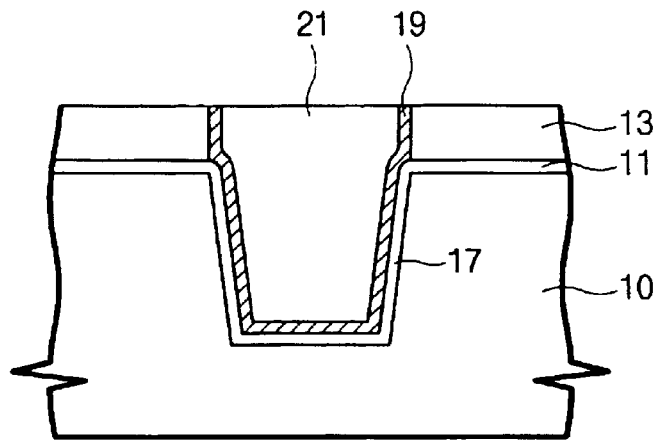
Figure 4:
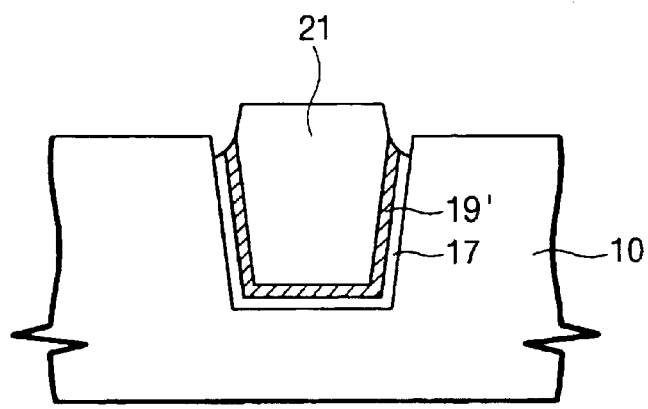
Figure 5:
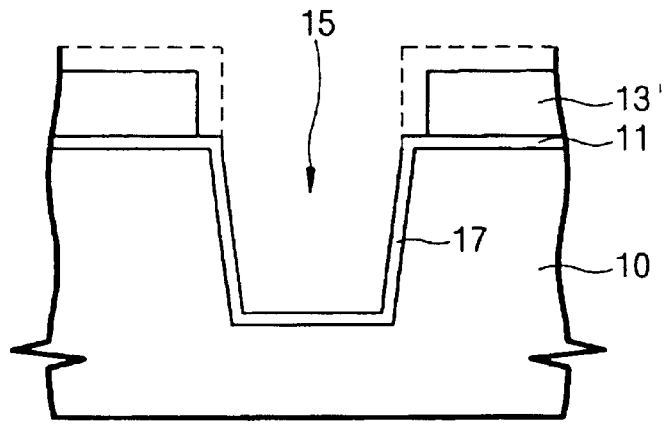
FIG. 5 to FIG. 7 illustrate flow diagrams of the process steps of a conventional method of forming an STI type semiconductor device by using a pull back process.
Figure 6:
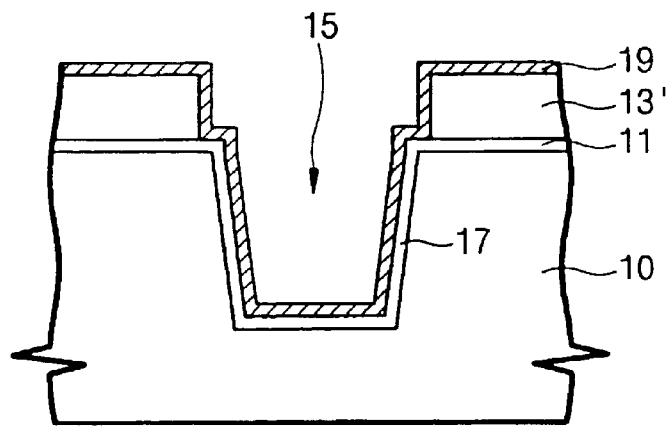
Figure 7:
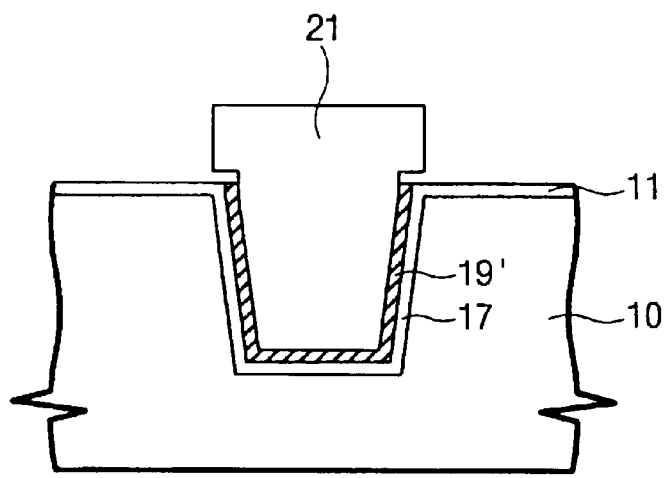
Figure 8:
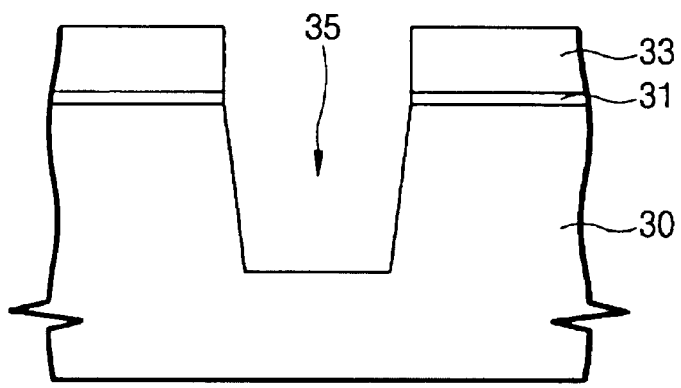
FIG. 8 to FIG. 15 illustrate flow diagrams of the process steps of a method of forming a STI type semiconductor device in accordance with the present invention.

Referring to FIG. 8, first a pad oxide film 31 is formed on the upper surface of a silicon substrate 30. The pad oxide film 31 is composed of thermal-oxides having a thickness of 100 Å. On the pad oxide film 31, a silicon nitride layer as an etch protecting layer 33 is deposited. Then, a patterning process is carried out in a general manner. The patterning process generally comprises forming a photo-resist layer, patterning the photo-resist layer through the photo-exposure and development to form a photo-resist pattern, and etching by using the photo-resist pattern as a mask. Alternatively, before carrying out the patterning process, a thin silicon oxide layer as a sacrificial layer can be formed on the etch-stop layer, and is conventionally patterned to act as a hard mask for the etch protecting layer 33. As a result of the patterning process, an etch protecting layer pattern is formed and the pad oxide film 33 in a trench region is removed. And then, after the photo-resist pattern is removed through an ashing strip process, the silicon substrate 30 is etched to a given depth to form a trench 35. At this time, alternatively, the photo-resist pattern can be removed after the forming of the trench 35.

Figure 9:
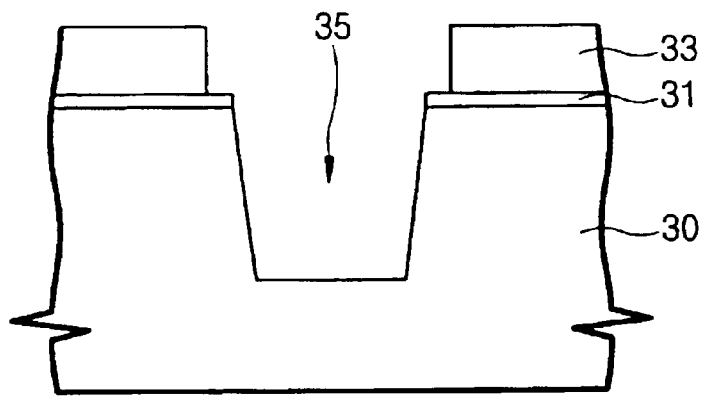

Referring to FIG. 9, a pull back process is carried out to the whole surface of the substrate 30 in which the trench 35 is formed. That is, the etch protecting layer 33 covering an active region is isotropically etched. As a result, all exposed surface of the etch protecting layer 33 is etched, so that its thickness and width are reduced. An inner wall of the etch protecting layer pattern vertically aligned with an inner wall of the trench 35 is laterally reduced by as much as a width of 50 to 1,000 Å. Consequently, the etch protecting layer pattern is transformed into a reduced pattern 33'. As the thickness of the etch protecting layer 33 is reduced, a silicon nitride liner 39 to be formed later can be restrained from being over-etched during a subsequent wet etching process for completely removing the reduced pattern 33'. At this time, the pad oxide film 31 is scarcely removed.

Figure 10:
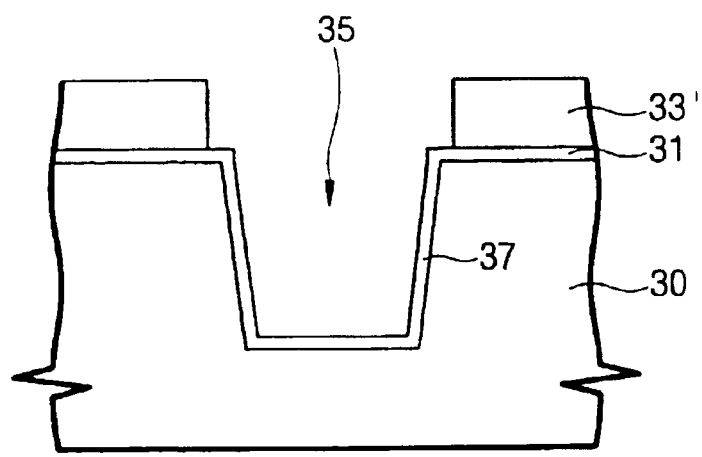

Referring to FIG. 10, a thermal oxidation process is carried out to the inner wall of the trench 35. The thermal oxidation process cures damages generated on the inner wall of the trench 35 during the isotropic etching of the etch protecting layer 33. Since the upper surface of the substrate 30 is covered with the pad oxide film 31 and the etch protecting layer 33, it is not oxidized very much. However, on the exposed surface of the substrate 30 forming the inner wall of the trench 35, a surface oxide film 37 is formed. At this time, an edge portion of the upper surface of the substrate 30 in the active region and a top end of the inner wall of the trench 35 connected thereto are maintained to be angular. The thickness of the thermal oxide film 37 is made more than 200 Å.

Figure 11:
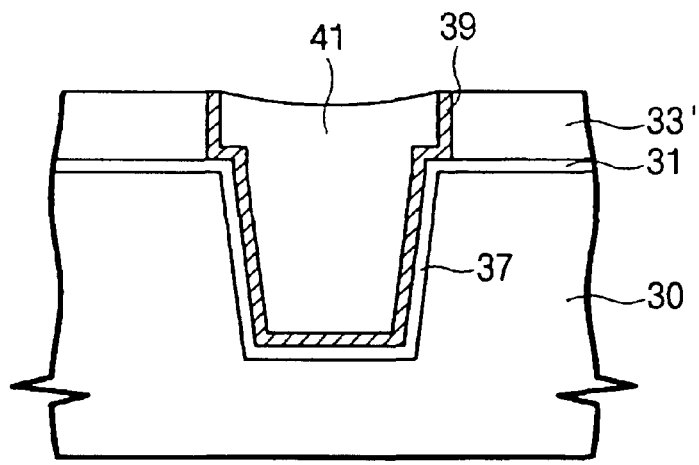

Referring to FIG. 11, a liner 39 for the oxygen diffusion barrier is formed over the whole surface of the substrate 30 on which the surface oxide film 37 is formed. The liner 39 is usually formed of silicon nitrides to a thickness of 50–100 Å by means of a CVD process. Preferably, a thickness of the liner 39 is within the range of 60 to 70 Å. If the liner 39 is too thick, the dent phenomenon due to the over-etching can occur. Generally, the thickness of the liner 39 is maintained below about 150 Å. Since the liner 39 is composed of the same material as that of the reduced pattern 33', a portion of the liner 39 formed on the surface oxide film 37 in the trench 35 is more important than the other portion thereof. Also, the portion of the liner 39 is extended onto the pad oxide film 31 in the active region as much as the width of the etch protecting layer 33 reduced laterally by means of the pull back process.

Next, a CVD silicon oxide layer is deposited to fill the trench 35. Then, the CVD silicon oxide layer formed on the upper surface of the reduced pattern 33' is removed to form an isolation layer 41 through a planarization etching process. The planarization etching process is usually carried out by means of rather a chemical-mechanical polishing (CMP) than an etch back. Consequently, upper portions of the reduced pattern 33' and the liner 39 are removed. Also, since the pull back process has been carried out before the planarization etching process, a portion of the isolation layer 41 formed in a gap or opening of the reduced pattern 33' comes to have a width larger than that of the trench 35.

Figure 12:
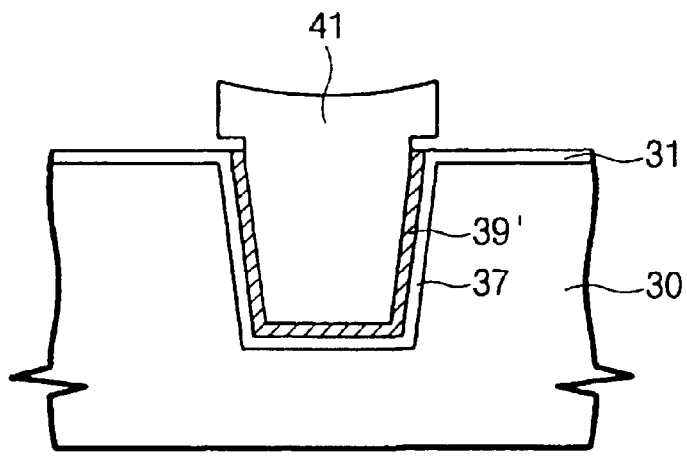

Referring to FIG. 12, a wet etching process is carried out to remove the reduced pattern 33' completely from the substrate 30. In the wet etching process, phosphoric acid is usually used as an etchant. However, when the etch protecting layer forming the reduced pattern 33' is formed of silicon nitrides, fluoride and the like can be added to the phosphoric acid. With the wet etching process, a portion of the liner 39 extended onto the pad oxide film 31 is removed along with the reduced pattern 33'. Preferably, after the reduced pattern 33' is removed, a top end of the liner 39 is to be located at the same level as or a level 150 Å higher than the upper surface of the silicon substrate 30.

Figure 13:
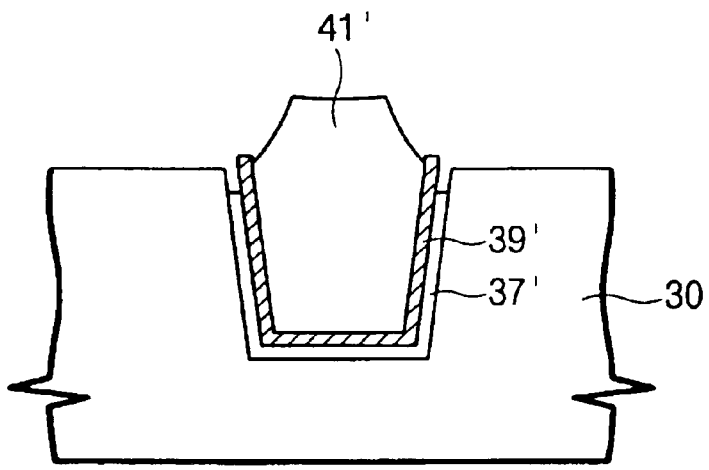

Referring to FIG. 13, after the reduced pattern 33' is removed, the pad oxide film 31 is removed. At this time, since the pad oxide film 31 is wet-etched, the isolation layer 41 is also removed to a given thickness. Also, a top end of the thermal-oxide film 37 formed on the inner wall of the trench 35 is removed by over-etching for a given time. To prevent the liner 39' from being damaged during the removing of the thermal-oxide film 37, an etchant of fluoride such as hydrofluoric acid and ammonium fluoride having an etch selectivity with respect to the silicon nitride liner 39 is used.

It is preferable that the top end of the thermal-oxide film 37 is removed to a depth within the range of 100 to 350 Å, preferably 200 Å, which corresponds to 0.5 to 2 times as much as a thickness of a silicon oxide film to be formed on the substrate 30 later. The reason for this is that when the substrate 30 is oxidized, silicon amounting to 40 to 50% of silicon oxide in thickness is generally consumed in forming the silicon oxide. For example, supposing that a total thickness of a buffer oxide film and a gate oxide film is within the range of about 200 Å, when the top end of the thermal-oxide film 37 is removed to a depth of 100 Å from the upper surface of the substrate to form a space or gap, a portion of the space formed under the upper surface of the substrate can be occupied with the buffer oxide film and the gate oxide film to be formed in a sequent process. However, when the top end of the thermal-oxide film 37 is removed to a depth of below 0.5 times as much as the total thickness, for example below 100 Å, an edge portion of the upper surface of the substrate in the active region is scarcely exposed to the air, so that it cannot be oxidized to form an oxide film having a sufficient thickness. Also, when the top end of the thermal-oxide film 37 is removed to a depth of more than two times as much as the total thickness, for example more than 400 Å, the edge portion of the upper surface of the substrate in the active region can be sufficiently oxidized, but the 'dent' problem can occur.

Figure 14:
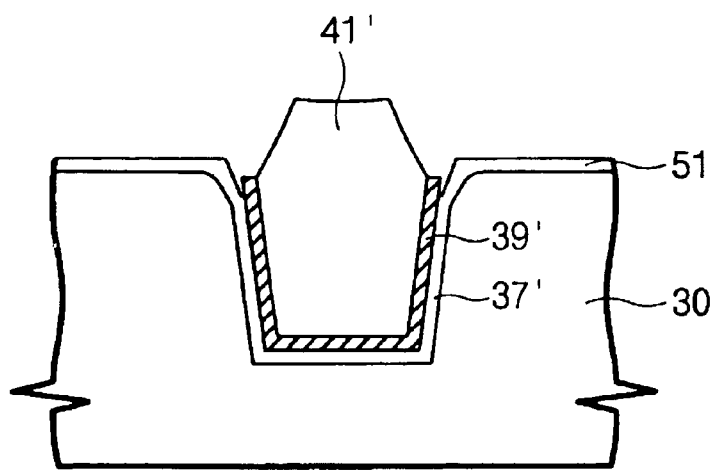

Referring to FIG. 14, a buffer insulating film 51 for ion implantation is formed over the whole surface of the substrate 30 on which the pad oxide film 31 is removed to expose the active region. The buffer insulating film 51 is formed of thermal-oxides having a thickness of 100 to 150 Å. The thermal oxidation easily occurs at portions where oxygen can be rapidly diffused. Since the edge portion of the upper surface of the substrate in the active region is exposed as the top end of the thermal-oxide film 37 is removed, oxygen can be sufficiently supplied to it. Also, it is well known in the art that the inner wall of the trench 35 is oxidized faster than the upper surface of the substrate 30. Accordingly, after the buffer insulating film 51 is formed, the edge portion of the upper surface of the substrate in the active region is transformed from angled shape to rounded shape.

Referring to FIG. 15, the buffer insulating film 51 is removed by means of an etchant or detergent of fluoride such as hydrofluoric acid after carrying out the ion implantation process. Then, a gate insulating film 52 is formed to a thickness of 50 to 100 Å on the exposed surface of the substrate 30. At this time, since the rounded edge portion of the upper surface of the substrate in the active region is also exposed to the space formed after the top end of the thermal-oxide film 37 is removed, it is oxidized as rapidly as the buffer insulating layer 51. Consequently, the resultant edge portion of the upper surface of the substrate in the active region comes to have a radius of curvature larger than that of the above rounded edge portion. Also, the space which has been formed laterally from the top end of the inner wall of the trench 35 while removing the top end of the thermal-oxide film 37 comes to be filled with the gate insulating film 52. Particularly, a lower portion of the space is almost filled. Thus, a dent, which is filled with polysilicon to form a bridge in the following process such as a polysilicon deposition process, does not occur.

As apparent from the foregoing description, it can be appreciated that the present invention can prevent the 'dent' phenomenon since the pull back process is carried out while the isolation layer is being formed. Also, the present invention can prevent a problem of reducing a thickness of the gate insulating film at the edge portion of the substrate in the active region by transforming it from angled shape to rounded shape through continuous oxidation and etching processes, thereby increasing reliability and stability of the device.

In the drawings and specification, there has been disclosed typical preferred embodiments of the present invention and, although specific terms are employed, they are used in a generic and descriptive sense only and not for purpose of limitation, the scope of the present invention being set forth in the following claims.

What is claimed is:

1. A shallow trench isolation type semiconductor device comprising:
   at least one trench formed on a silicon substrate to define at least one active region;
   a silicon thermal-oxide film formed on an inner wall of the trench;
   a CVD silicon oxide layer filling the trench on which the silicon thermal-oxide film is formed, to form an isolation layer; and
   an edge portion of the substrate in the active region forming a top end portion of the inner wall of the trench having a radius of curvature more than twice as much as a thickness of a gate oxide layer to be formed on the edge portion.

2. The shallow trench isolation type semiconductor device according to claim 1,
   wherein at least one liner for an oxygen diffusion barrier is interposed between the isolation layer and the silicon substrate; and
   wherein a top end of the liner is disposed above a level which is located below 150 Å from the upper surface of the silicon substrate.

3. The shallow trench isolation type semiconductor device according to claim 2, wherein the silicon thermal-oxide film is formed to a thickness of more than 200 Å.

4. A shallow trench isolation type semiconductor device comprising:
   an isolation layer formed on a silicon substrate to define at least one active region;
   a liner for oxygen diffusion barrier interposed between the isolation layer and the silicon substrate; and
   a horizontal distance from a top end of an inner wall of the liner to a corresponding level position on a plane vertically extended from an edge of the upper surface of the isolation layer is within the range of 300 to 600 Å, and a line extended from a center of the upper surface of the substrate in the active region to an edge of the upper surface of the substrate in the active region adjacent to the isolation layer has an angle of 15 to 35 degrees to a horizontal plane.

5. A shallow trench isolation type semiconductor device, comprising:
   at least one trench formed on a silicon substrate to define at least one active region;
   a silicon thermal-oxide film formed on an inner wall of the trench;
   a CVD silicon oxide layer filling the trench on which the silicon thermal-oxide film is formed, to form an isolation layer; and
   at least one liner for an oxygen diffusion barrier interposed between the isolation layer and the silicon substrate, wherein a top end of the liner is disposed above the upper surface of the silicon substrate by as much as 150 Å.

* * * * *